US008755305B2

(12) United States Patent
Altekar et al.

(10) Patent No.: US 8,755,305 B2
(45) Date of Patent: Jun. 17, 2014

(54) TRACK LIGHT POWERED ADAPTER FOR WIRELESS NETWORKING DEVICE

(76) Inventors: Girish Altekar, Austin, TX (US); Murray Freeman, Austin, TX (US)

( * ) Notice: Subject to any disclaimer, the term of this patent is extended or adjusted under 35 U.S.C. 154(b) by 23 days.

(21) Appl. No.: 13/545,485

(22) Filed: Jul. 10, 2012

(65) Prior Publication Data

US 2014/0016503 A1 Jan. 16, 2014

(51) Int. Cl.
*G01R 31/08* (2006.01)

(52) U.S. Cl.
USPC .......... 370/254

(58) Field of Classification Search
USPC .......... 370/254, 255
See application file for complete search history.

(56) References Cited

U.S. PATENT DOCUMENTS

2005/0245112 A1 11/2005 Shen
2006/0287813 A1* 12/2006 Quigley .......... 701/201
2009/0059606 A1 3/2009 Chien
2009/0284988 A1 11/2009 Snagel et al.
2012/0074843 A1* 3/2012 Recker et al. .......... 315/86

* cited by examiner

*Primary Examiner* — Mark Rinehart
*Assistant Examiner* — Angel Brockman
(74) *Attorney, Agent, or Firm* — Harper Washam LLP; Steven H. Washam

(57) ABSTRACT

A wireless networking device adapter for provisioning a wireless network using new or existing track lighting. The adapter securely engages the track light channel and supports a commercially available wireless access point (WAP) device. A lock mechanism on the adapter prevents unexpected disengagement of the adapter from the track light channel, yet allows for operator removal. A power converter within the adapter powers the WAP device from the electrical power provided by the track light channel. Multiple adapters communicate to form a mesh network to improve wireless network fault tolerance, or may operate in a repeater mode configuration or some combination.

10 Claims, 6 Drawing Sheets

TRACK LIGHT POWERED ADAPTER FOR WIRELESS NETWORKING DEVICE

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC

Not Applicable

BACKGROUND OF THE INVENTION

1. Field of the Invention

The present invention relates to an adapter device for interfacing wireless access point hardware with preexisting and new track lighting track systems.

2. Description of Related Art including Information Disclosed under 37 CFR 1.97 and 1.98

The exponential growth in the number of electronic devices requiring wireless computer network access is staggering. It is a rarity these days to encounter an individual that does not carry at least a smart phone capable of Wi-Fi access. In fact, most individuals now own and frequently carry multiple wirelessly networked devices capable of establishing wireless computer network connections. For example, gaming devices, tablet computers, laptop computers, and the like are so common that many retail outlets, hotels, and restaurants offer Wi-Fi Internet access to its patrons.

Businesses also are beginning to rely more on wirelessly networked devices to manage sales and inventory. For example, it is increasingly common to see grocery store personnel carrying handheld scanners for identifying shelved products. These handheld scanners interface with backroom computer databases by exchange of data over the store's wireless computer network. Use of a wireless network connection allows a freedom of movement of the scanner that is not possible with wired connections.

Wireless computer networks (for example, Wi-Fi networks as most commonly encountered) require wireless access points (WAP) or "hot spots" through which a user's wireless device may gain access to the network. Location of the WAP hardware is critical with regard to the layout of a building's interior space so that the wireless signal strength is sufficient throughout the space to support a device connection. With new construction it is sometimes possible to design the WAP locations into the building layout, thus ensuring an even distribution of wireless signal. However, changes to the building interior (for example, moving shelving units to a new location, setting up displays that absorb or reflect the wireless device signal, etc.) or a change in requirements where the wireless signal is to be provided can require a relocation of the WAPs or the addition of WAP devices to the overall network topology.

Classically, WAP device connections are wireless with regard to the user's handheld device connection, but are still wired with regard to the connection to the local area network (LAN). This wired connection ties the WAP into the computer network and, consequently, into the Internet. The Ethernet wall jack (or wall "drop" as it is known in the industry) is typically fixed in a particular location upon building construction and difficult to relocate, and expensive to add to existing structures. Thus, if the WAP must be moved the resulting run of Ethernet cable from the WAP to the jack can be unsightly and/or impractical to install, or could easily exceed the 100 meter limits of the wired Ethernet technology. Consider that most retail establishments (restaurants, grocery stores, etc.) have large open spaces with very few interior walls that can support Ethernet wall jacks. Also consider that ceilings are best suited to place these WAP/s. If the ceilings are finished in places like coffee shops, then adding these wires can be unsightly. Also, if ceilings are exposed in a "big box" type of structure, then distance is a problem. If a wireless signal "dead spot" exists, for example, in the central space away from the outer walls, often the wireless network layout in such spaces are often not optimal and Wi-Fi device users must put up with inconsistent, weak, or no wireless signal whatsoever in various locations.

In addition to networking, a power connection to the WAP must also be provided. While all locations providing WIFI have access power, the wall outlets are typically located on the peripheral walls and not where the WAPs are to be physically located. The cost of adding electrical conduits to already finished structures for the purposes of relocating WAPs is rarely justifiable, limiting placement of the WAP and adversely affecting the signal distribution and quality of the WIFI signal.

A goal of the invention is to correct the aforementioned appearance, distance, and flexibility constraints of the classic wireless network deployment model to improve the overall operational quality of the network while reducing installation costs and complexity. The present invention achieves this goal and others, as will be readily apparent following a thorough study and understanding of the disclosure herein.

BRIEF SUMMARY OF THE INVENTION

The present invention provides a track light powered adapter for a wireless networking device, the adapter comprising: an enclosure including a track connection member, a locking member, and a power conversion member, the track connection member capable of physically engaging a track light channel to detachably secure the enclosure thereon, the track connection member including electrical contacts capable of engaging the track light channel electrical conductors and providing electrical power from the electrical conductors to the power conversion member, the locking member capable of physically engaging the track light channel to prevent undesired disengagement of the track connection member therefrom; and a support member including at least one wireless networking device engagement member, the engagement member capable of detachably securing a wireless networking device thereon, the power conversion member capable of providing electrical power to a wireless networking device secured thereon. Variations on this adapter are likewise disclosed and claimed herein.

The present invention further provides a method for providing a wireless network, the method steps comprising: providing a plurality of wireless networking device adapters, each adapter comprising: an enclosure including a track connection member, a locking member, and a power conversion member, the track connection member capable of physically engaging a track light channel to detachably secure the enclosure thereon, the track connection member including electrical contacts capable of engaging the track light channel electrical conductors and providing electrical power from the electrical conductors to the power conversion member, the locking member capable of physically engaging the track light channel to prevent undesired disengagement of the track connection member therefrom; and a support member including at least one wireless networking device engagement member, the engagement member for detachably securing a wireless networking device thereon, the power conversion member capable of providing electrical power to a wireless networking device secured thereon; detachably securing a wireless access point (WAP) device to the support member of each of the plurality of wireless networking device adapters and electrically connecting each WAP device to the respective power conversion member; and attaching the wireless networking device adapters to a track lighting system track within a building structure, wherein the adapters are within radio communication range of one another and wherein the adapters are disposed to provide wireless network coverage within the building structure. Variations on this method are likewise disclosed and claimed herein.

BRIEF DESCRIPTION OF THE SEVERAL VIEWS OF THE DRAWING(S)

The present invention will be more fully understood by reference to the following detailed description of the preferred embodiments of the present invention when read in conjunction with the accompanying drawings, wherein.

Figure 1:
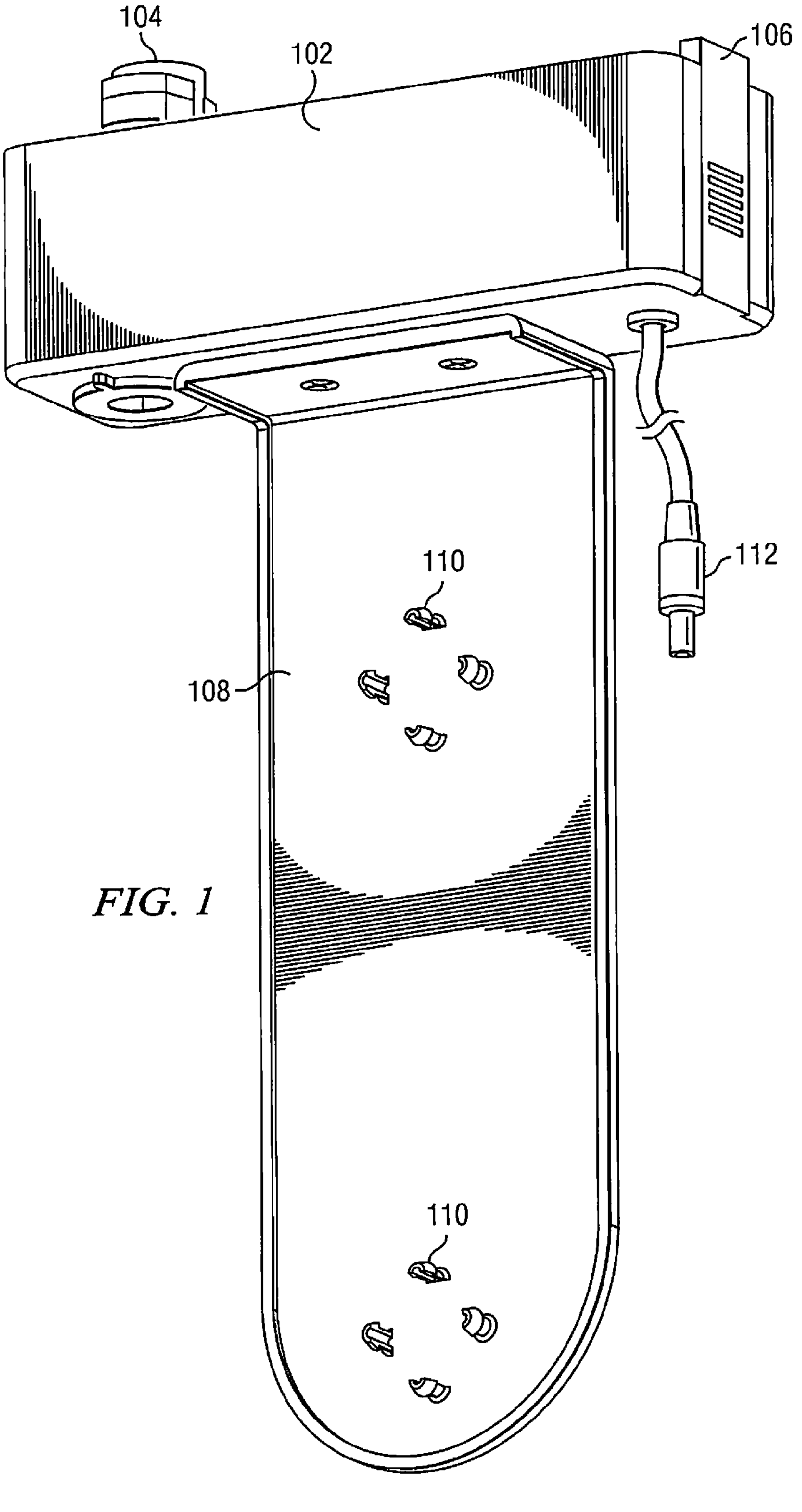
FIG. 1 is an isometric view of an embodiment of the wireless networking device adapter of the present invention, highlighting the adapter without a wireless networking device installed thereon.

The above figures are provided for the purpose of illustration and description only, and are not intended to define the limits of the disclosed invention. Use of the same reference number in multiple figures is intended to designate the same or similar parts. Furthermore, when the terms "top," "bottom," "first," "second," "upper," "lower," "height," "width," "length," "end," "side," "horizontal," "vertical," and similar terms are used herein, it should be understood that these terms have reference only to the structure shown in the drawing and are utilized only to facilitate describing the particular embodiment. The extension of the figures with respect to number, position, relationship, and dimensions of the parts to form the preferred embodiment will be explained or will be within the skill of the art after the following teachings of the present invention have been read and understood.

DETAILED DESCRIPTION OF THE INVENTION

As used herein the terms "wireless network" and "wireless computer network" mean Wi-Fi, Zigbee, or any similar computer networking standard that supports wireless data transmission and TCP/IP protocol. Such networks currently operate based on the IEEE 802.11 set of standards, which are hereby incorporated by reference herein. However, one of ordinary skill will appreciate that the present invention is not limited to a particular wireless networking standard but is intended to embrace future versions and iterations of wireless computer networks that may or may not evolve or extend from the 802.11 standards. A wireless network is an extension of a wired network. The term "network" or "computer network" can mean a personal area network (PAN), local area network (LAN), wide area network (WAN), metropolitan area network (MAN), campus area network (CAN), or the like, as such networks are commonly known. One of ordinary skill in the art to which the invention pertains will understand and appreciate that management of such a network—wired or wireless—is well known and commonly practiced and need not be described in greater detail herein.

As used herein the terms "mesh network" and "wireless mesh network" mean Wi-Fi enabled mesh or any wireless device network topology in which a plurality of wireless nodes interconnect to form a wireless local area network (WLAN) having multiple paths for data packets to travel between nodes. For example, the current 802.11s standard defines such a wireless mesh-networking standard. However, one of ordinary skill will appreciate that the present invention is not limited to a particular mesh-networking standard but is intended to embrace future versions and iterations of mesh networks that may or may not evolve or extend from the 802.11s standards.

As used herein the term "wireless access point" (WAP) is a well-known device that connects one or more wireless devices to an adjacent wired LAN. A WAP converts the traffic of a wired network into a wireless network—using industry standards to add and expand the wired packets with transmission information to allow delivery via a congested shared media, allowing wireless devices to communicate with other wired and/or wireless devices. A WAP is a wireless networking device. Other examples of wireless networking devices include a wireless bridge, a wireless repeater, and the like.

FIG. 1 is an isometric view of an embodiment of the wireless networking device adapter of the present invention, highlighting the adapter without a wireless networking device installed thereon. As depicted, the major segments of the embodiment include an enclosure (102) and a support member (108). The enclosure (102) and support member (108) of the present embodiment are constructed from a polymer material. However, other embodiments may be constructed from metal, ceramic, or some combination of polymer, metal, and/or ceramic. For example, it may be preferable to utilize aluminum or another metal for the enclosure (102) to serve as a heat sink for the electronics contained therein. The support member (108), likewise, may benefit from use of metal construction for strength relative to an attached wireless networking device as well as to serve as a heat sink for heat generated therein.

The support member (108) of the embodiment depicted is attached to the base of the enclosure (102), and is substantially "L"-shaped such that it extends perpendicularly from the plane of the enclosure base. The support member (108) is physically attached to the base using removable or permanent fasteners (for example, screws and locknuts, rivets, or the like), or is welded or molded to the enclosure (102) base such that it is capable of supporting the weight of an attached network device without concern for separation of the support member from the enclosure base. In the present embodiment the support member (108) is permanently attached using spot welds. However, in another embodiment the support member (108) is removably attached to allow the support member to be changed to match the mounting features of an attached wireless network device.

The support member (108) also includes engagement members (110) that are capable of engaging the mounting features of a wireless networking device. As depicted are tabs protruding in a substantially perpendicular fashion from the plane of the support member (108), disposed to align with the typical keyhole mounting features of a wireless networking device enclosure, and arranged in a substantially circular fashion to engage the edges of the keyhole mounting feature and detachably secure the wireless networking device enclosure to the support member. When engaged, the members (110) are sufficiently capable of securing the networking device to the support member (108) to prevent unexpected detachment. The engagement members (110) are also capable of minor deflection when force is applied to allow for subsequent removal of a wireless networking device. While the present embodiment depicts tab engagement members (110), other embodiments may utilize posts, screws, bolts, rivets, or the like. In another embodiment the engagement members (110) each comprise a post having a rubber center portion that is compressible yet sized slightly larger than the keyhole mounting feature of a wireless networking device. As such, when a wireless networking device is installed the rubber center portion grips the edges of the keyhole opening to provide physical retention of the device.

Figure 2:
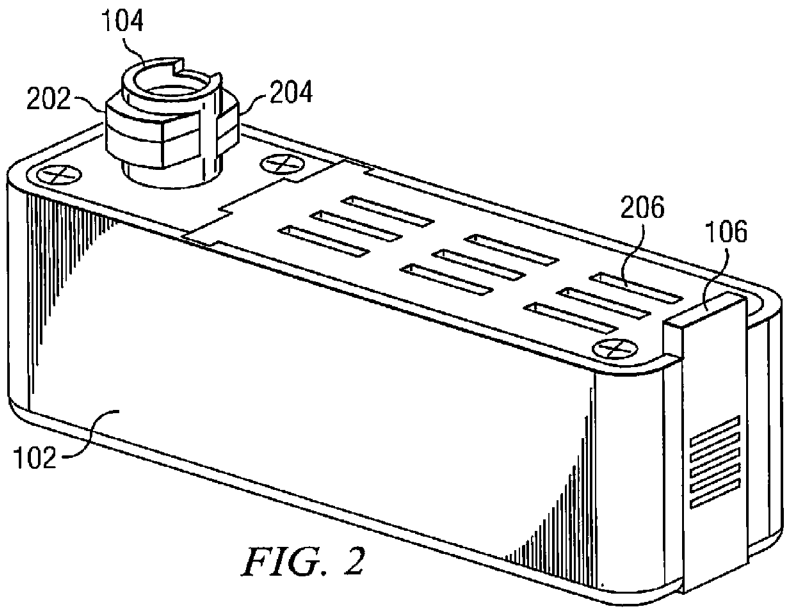
FIG. 2 is a magnified image of the enclosure of the embodiment of the adapter, highlighting the engagement features of the adapter.

The enclosure (102) includes a track connection member (104) and a locking member (106), both working in conjunction to detachably secure the enclosure (102) to a track lighting channel. FIG. 2 depicts the top of the enclosure (102) in greater detail, emphasizing the construction and location of these additional members. As shown, the track connection member (104) includes support extensions (202 and 204) with electrical conductors for engaging the conductors of the track lighting channel. When the connection member (104) is engaged with the track lighting channel, the electrical conductors engage the power conductors embedded within the channel and provide a path for current to flow from the track lighting channel to the power conversion electronics housed within the enclosure (102). The moveable locking member (106) exists on the end of the enclosure (102) opposite that of the connection member (104), and is biased to remain in an upward position (as shown) such that a portion protrudes from the top surface of the enclosure (102). Downward force applied by an operator on the locking member (106) will cause the locking member to be temporarily displaced downward such that very little or none of the locking member protrudes above the enclosure (102) top surface. Also shown is a louvered panel (206) that provides ventilation for the power conversion electronics housed within the enclosure (102). A power cable (112) is also provided to supply power from the power converter to a wireless networking device secured thereon.

Figure 3:
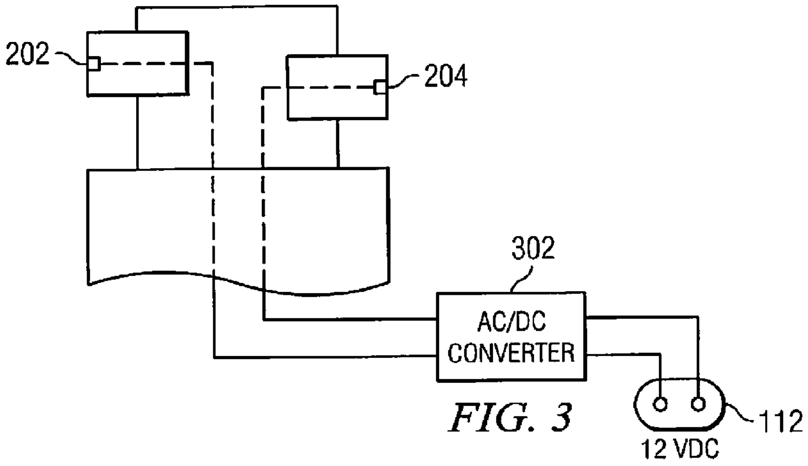
FIG. 3 is an electrical schematic diagram of the power converter member of an embodiment of the adapter to provide power to a mounted wireless network device.

FIG. 3 is an electrical schematic diagram of the power converter member of an embodiment of the adapter to provide power to a mounted wireless network device. Typical track lighting systems utilize 110 VAC or 220 VAC power, while wireless networking devices require 5 VDC, 12 VDC, or other voltages typically below 48 VDC. Thus, it becomes necessary to convert the supplied AC voltage to a useable DC voltage. As shown, the support extension electrical conductors (202 and 204) that engage the track lighting channel conductors are, themselves, electrically connected to an AC to DC power converter (302). This converter changes the supplied AC voltage/current to a DC voltage/current that is useable by an attached wireless network device. The converted DC voltage is subsequently provided to the attached wireless networking device through a jack or connector (304) appropriate for the networking device. One of ordinary skill in the art to which the invention pertains will appreciate that the workings of an AC/DC converter circuit are well known and commonly practiced and, therefore, it is not necessary to describe the components in greater detail herein.

Figure 4:
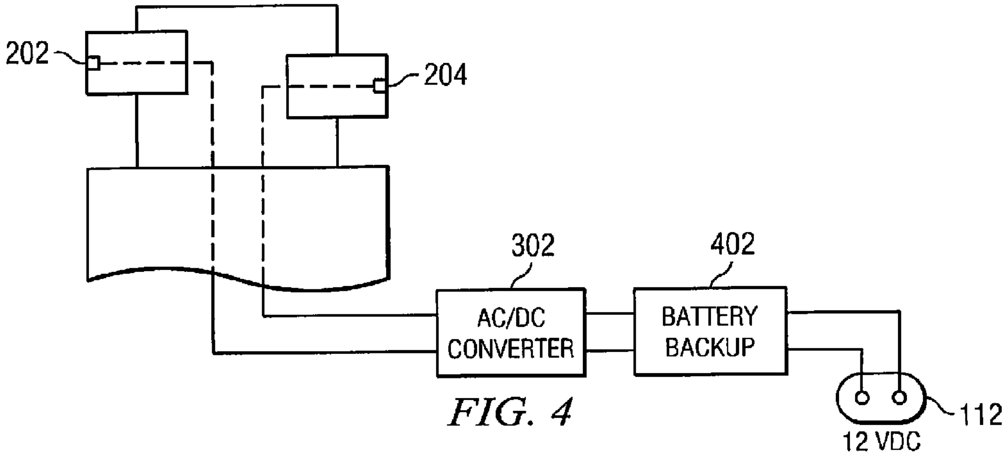
FIG. 4 is an electrical schematic diagram of the power converter member of another embodiment of the adapter, depicting the provision of a battery backup to support operation of a mounted wireless network device in the event of a primary power loss.

FIG. 4 depicts an electrical schematic diagram of the power converter member of another embodiment of the adapter. If power to the track lighting system is lost, power may also be lost to the adapter and the attached wireless networking device, which would cause the wireless network to fail. The circuit depicted herein provides for an increased level of fault tolerance by providing a battery backup circuit (402) that senses loss of primary power and continues to provide the required power for a period of time to the network device (304). If the primary power returns before the capacity of the uninterruptible power supply circuit (402) is lost, then no interruption will be observed with the wireless network. One of ordinary skill in the art to which the invention pertains will appreciate that the workings of a battery backup circuit are well known and commonly practiced and, therefore, it is not necessary to describe the components in greater detail herein.

Figure 5:
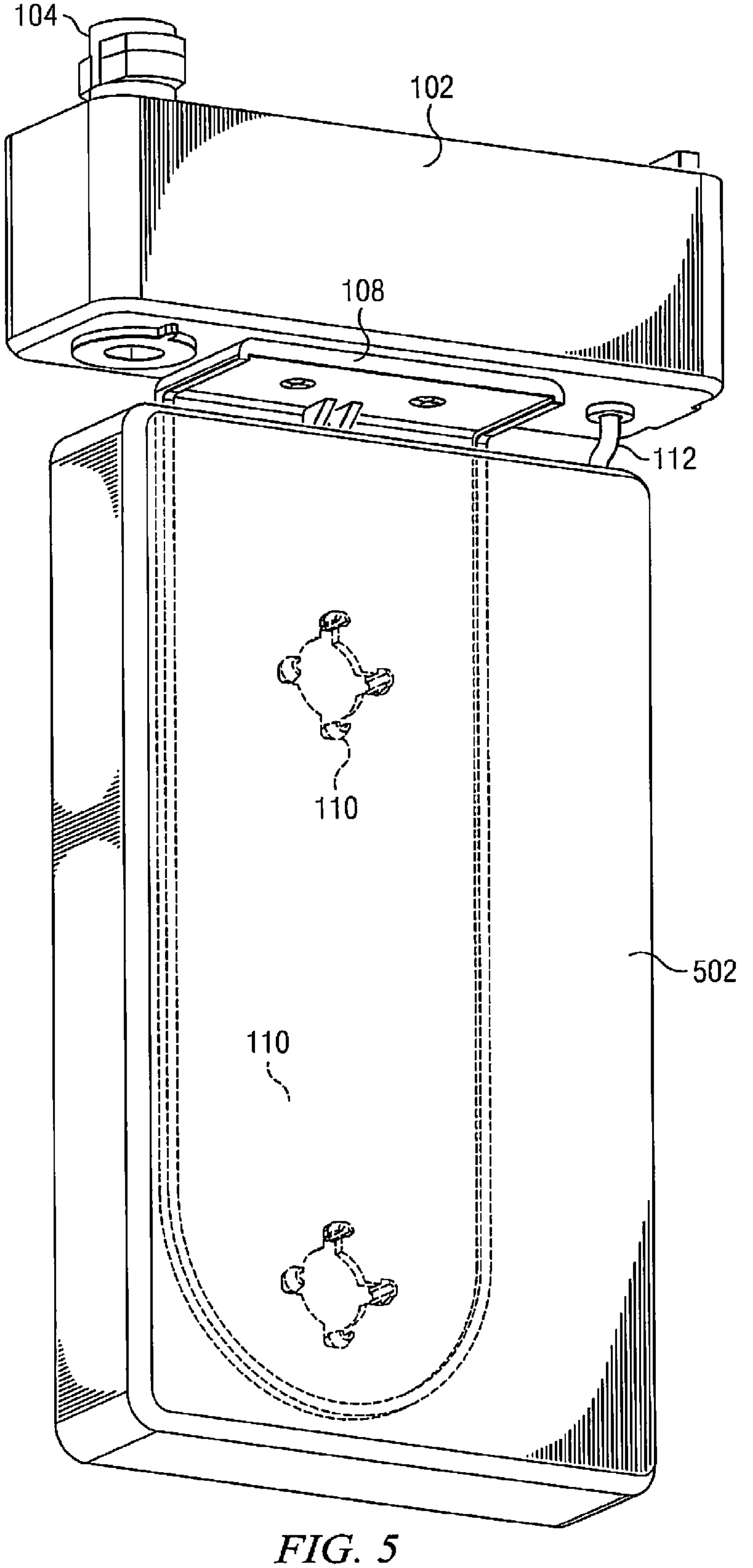
FIG. 5 is an isometric view of an embodiment of the wireless networking device adapter of the present invention, highlighting the adapter with a wireless networking device installed thereon.
Figure 6:
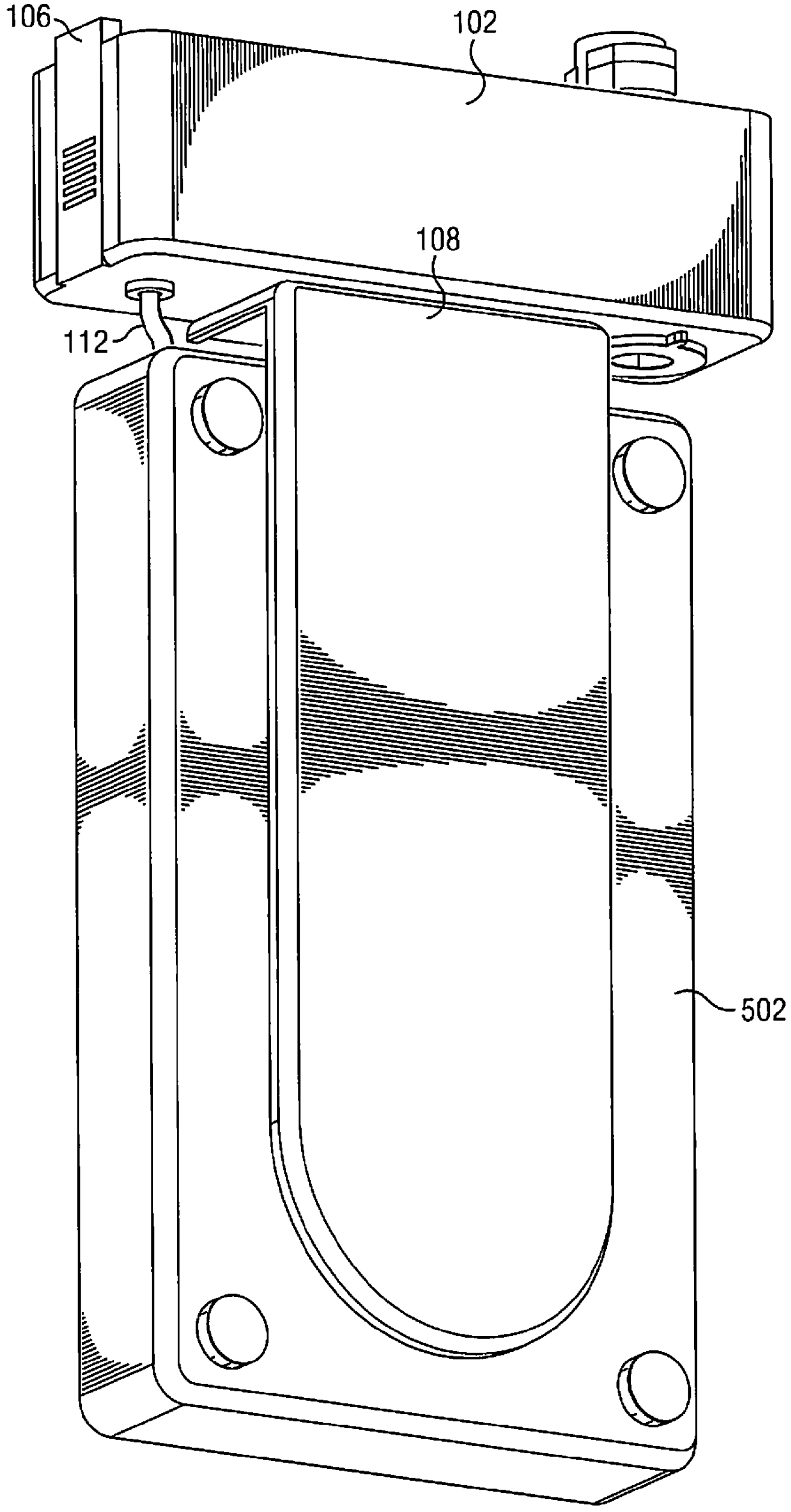
FIG. 6 is an isometric view of the rear of the embodiment, highlighting the support member in conjunction with the installed wireless networking device.

FIG. 5 provides an isometric view of an embodiment of the wireless networking device adapter of the present invention, highlighting the adapter with a wireless networking device installed thereon. The wireless networking device (502) is detachably secured to the support member (108) by engaging the engagement members (110). As stated previously, the engagement member (108) tabs of the present embodiment fit within the keyhole mounting features on the networking device (502). Other embodiments utilize engagement members suitable for the requirements of the networking device (for example: screws or bolts; rivets; posts; or the like). FIG. 6 is an isometric view of the rear of the embodiment, providing another view angle of the attached wireless networking device (502). The nature of the overall adapter/device combination is sufficiently compact such that the installed unit is relatively unobtrusive.

Figure 7:
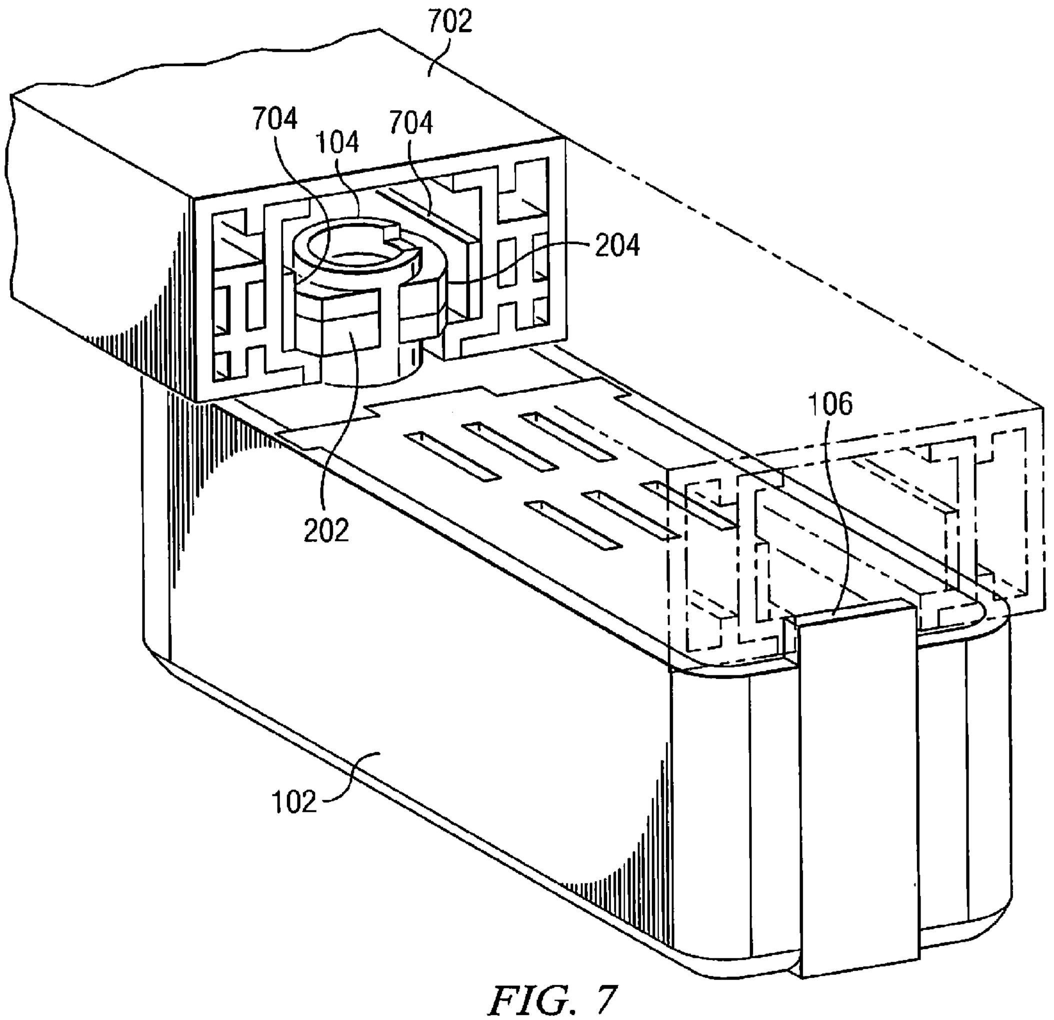
FIG. 7 is a depiction of the enclosure track light channel engagement feature as it appears when engaged within a track light channel.

FIG. 7 depicts the enclosure track light channel engagement feature as it appears when engaged within a track light channel. As shown, the track light channel (702) houses strips of conductors (704) within the channel. These conductor strips (704) conduct AC voltage and current along the length of the channel, and allow an engaged track lighting device to obtain power at essentially any point along the channel. The adapter (102) track connection member (104) support extensions (202 and 204) engage the channel edges and detachably secure the adapter (102) within the channel. If the adapter (102) is rotated about the connection member (104) by 90 degrees in either direction, the support extensions (202 and 204) will disengage the channel edges and the adapter (102) will be capable of removal from the channel (702). The locking member (106) is a movable feature on the adapter (102). As shown the locking member (106) is in the locked position, with its upper protrusion engaging the track channel thereby preventing the aforementioned rotation of the adapter (102). A biasing spring or similar mechanical feature maintains the locking member (106) in this position. An operator may actuate the locking member (106) by hand by moving the locking member downward such that the top edge of the locking member substantially no longer protrudes above the top surface of the enclosure (102), thereby disengaging the locking member from the track lighting channel. In this position, the adapter enclosure (102) may be rotated freely about the axis of the track connection member (104). One of ordinary skill will appreciate that track lighting channel construction and operation is well understood and commonly practiced, so additional detail in this regard is unnecessary for a full understanding and enabling of the invention claimed herein.

Figure 8:
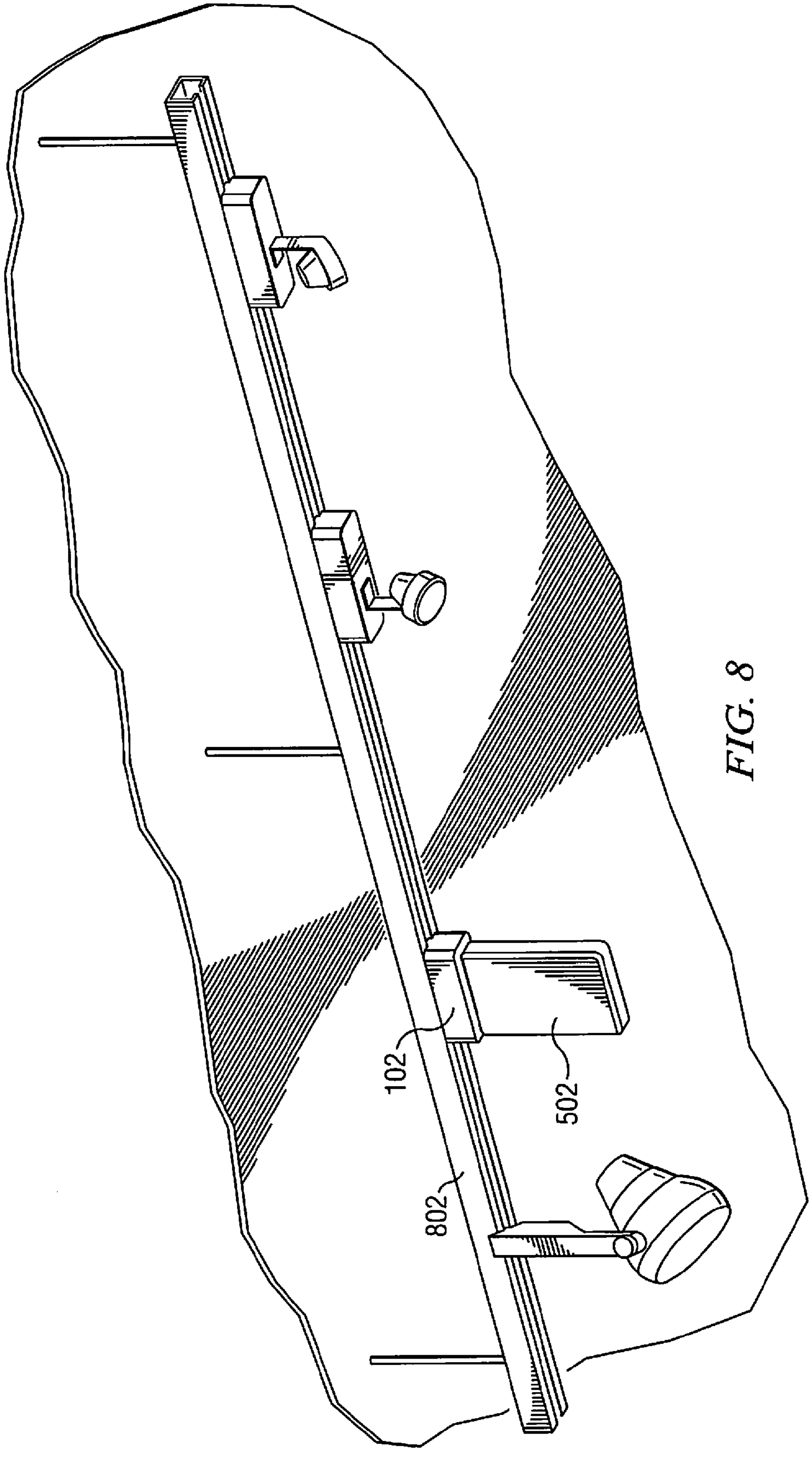
FIG. 8 is a depiction of the embodiment of the wireless networking device adapter of the present invention with a wireless networking device, installed in the track lighting channel as used in a retail establishment.

FIG. 8 is a depiction of the embodiment of the wireless networking device adapter of the present invention with a wireless networking device installed thereon, the adapter installed in the track lighting channel as use in a retail establishment. A wireless network having full coverage of the expanse of interior of a large retail establishment may be achieved through utilization of a plurality of adapters as depicted and disclosed herein. To begin, a WLAN is first configured in the establishment by providing a root node WAP having a wired connection to the LAN (likely near a perimeter wall of the space). Next, a separate WAP device (502) is installed on each of a plurality of adapters as disclosed herein. Within a plurality of the WAP devices, including the root note, is firmware capable of causing the WAP device upon which it is installed to establish a wireless mesh network among like WAP devices. This mesh-networking firmware causes the WAP upon which it is installed to communicate with other like WAP devices in the exchange of packetized data. One of ordinary skill will appreciate that this firmware is proprietary to the manufacturer of a WAP and known in the art and, therefore, need not be described herein in further detail.

The network in this embodiment utilizes wireless network devices that function in a "repeater mode" and are able to extend a wireless network signal within the large space. In "repeater mode" the device communicates with an existing primary WAP device using one virtual WAP, then communicate to the client devices using one or more physical radios and one or more virtual WAP/s. Roaming between WAP/s is as described above and is unaffected by the choice or wired or repeater operation of the WAP/s. This "repeater" mode may be implemented using the industry standard WDS method, or by using a "mesh" method. In this "repeater" environment, only a fraction of the WAP devices (for example, one in 8 or any number chosen by the operator) needs to have a wired connection to feed the repeaters. Remote management tools report WAP/s that are underutilized or defective, allowing for both redundancy and avoiding an overpopulation of WAP/s within a given space. Thus, if the labor costs of deploying these WAP's can be reduced; the WAP/s can be moved easily to adapt to location and coverage needs; the need for Ethernet wires to each WAP can be eliminated; and the number of WAP/s per location can be minimized; then it is possible to provide reliable Wi-Fi to users and store infrastructure at a fraction of existing costs.

Next, a signal strength meter may be utilized to determine the strength of the WLAN signal at various locations within the retail establishment. This signal strength reading may be obtained using a dedicated signal strength meter or by use of a device having wireless networking capability as essentially all such devices (laptops, smart phones, etc.) have some form of signal strength indicator. The plurality of adapters with WAP devices secured thereon may then be arranged within the interior in such a fashion as to provide wireless signal coverage in the low coverage areas, thereby extending the WLAN. Once a location is determined for each WAP, the adapter may be installed within an existing track lighting channel nearest the desired location of the WAP.

As described above, the adapter enclosure (102) may be positioned such that its length is perpendicular to the track lighting channel (802) and the track connection member may be inserted within the channel. The enclosure rotated ninety degrees such that the enclosure is parallel with the channel (802) and the adapter enclosure (102) locking member engaged therein to prevent undesired disengagement of the device. Power from the track lighting channel is converted within the adapter enclosure power conversion member to achieve the necessary voltage/current required for proper WAP device operation, and this converted power is supplied to the WAP device to enable its operation. A mesh network having a shared SSID may then be established among the WAP devices to provide fault tolerance for the overall WLAN, allowing a portable computing device having wireless networking capability to roam within the retail establishment without losing its wireless network connection. Thus, from the standpoint of the portable computing device, the WLAN appears as a single seamless WLAN with a single SSID. Another embodiment may utilize a simple repeater mode configuration (no mesh network). However, such configuration does not have the fault-tolerance advantage of a mesh network. Yet another embodiment may enjoy some combination of mesh network and repeater mode devices. Moreover, if, after installation, it is determined that a "dead spot" (weak or no wireless signal strength is present) within the building interior exists or develops, one or more of the WAP/adapter devices may be repositioned within the track lighting channel to compensate for the poor signal strength or additional WAP/adapters may be installed to compensate.

The invention may be embodied in other specific forms without departing from the spirit or essential characteristics thereof. The present embodiments are therefore to be considered in all respects as illustrative and not restrictive. Accordingly, the scope of the invention is established by the appended claims rather than by the foregoing description. All changes which come within the meaning and range of equivalency of the claims are therefore intended to be embraced therein. Further, the recitation of method steps does not denote a particular sequence for execution of the steps. Such method steps may therefore be performed in a sequence other than that recited unless the particular claim expressly states otherwise.

We claim:

1. A track light powered adapter for a wireless networking device, the adapter comprising:

an enclosure including a track connection member, a locking member, and a power conversion member, the track connection member for physically engaging a track light channel to detachably secure the enclosure thereon, the track connection member including electrical contacts for engaging the track light channel electrical conductors to provide electrical power from the electrical conductors to the power conversion member, the locking member for physically engaging the track light channel to prevent undesired disengagement of the track connection member therefrom; and a support member including at least one wireless access point device engagement member, the engagement member for detachably securing a wireless access point device thereon, the power conversion member for providing electrical power to a wireless access point device detachably secured thereon.

2. The track light powered adapter of claim 1, the adapter further comprising:

a wireless access point (WAP) device detachably secured to the support member and electrically connected to the power conversion member.

3. The track light powered adapter of claim 1, the adapter further comprising:

a wireless access point (WAP) device detachably secured to the support member and electrically connected to the power conversion member, the WAP capable of establishing a mesh network with other like devices.

4. The track light powered adapter of claim 1, the adapter further comprising:

a battery backup device, wherein the battery backup device provides power to the detachably secured wireless networking device in the event that the track light channel becomes de-energized.

5. The track light powered adapter of claim 1, wherein the wireless access point device engagement member engages a wireless access point device using the wireless access point device enclosure standard mounting features.

6. A method for providing a wireless network, the method steps comprising:

providing a plurality of wireless networking device adapters, each adapter comprising:

an enclosure including a track connection member, a locking member, and a power conversion member, the track connection member for physically engaging a track light channel to detachably secure the enclosure thereon, the track connection member including electrical contacts for engaging the track light channel electrical conductors to provide electrical power from the electrical conductors to the power conversion member, the locking member for physically engaging the track light channel to prevent undesired disengagement of the track connection member therefrom; and a support member including at least one wireless access point engagement member, the engagement member for detachably securing a wireless access point device thereon, the power conversion member for providing electrical power to a wireless access point device secured thereon;

detachably securing a wireless access point (WAP) device to the support member of each of the plurality of wireless networking device adapters and electrically connecting each WAP device to the respective power conversion member; and attaching the wireless networking device adapters to a track lighting system track within a building structure, wherein the adapters are within radio communication range of one another and wherein the adapters are disposed to provide wireless network coverage within the building structure.

7. The method of claim 6, the method steps further comprising:

establishing a mesh network among the WAP devices for improving the fault tolerance of the network.

8. The method of claim 6, the method steps further comprising:

configuring at least one WAP device as a wireless repeater.

9. The method of claim 6, the method steps further comprising:

installing an additional wireless networking device adapter with a wireless access point device detachably secured thereon to compensate for a weak wireless network signal proximate the installation location.

10. The method of claim 6, the method steps further comprising:

establishing a mesh network among the WAP devices for improving the fault tolerance of the network; and remotely managing the mesh network.

* * * * *